United States Patent
Lee et al.

(10) Patent No.: US 11,336,762 B2
(45) Date of Patent: May 17, 2022

(54) ELECTRONIC DEVICE FOR PROTECTING COMPONENTS FROM SURGE VOLTAGE AND STRUCTURE THEREOF

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Jongsung Lee, Suwon-si (KR); Cheolgu Jo, Suwon-si (KR); Byongsu Seol, Suwon-si (KR); Jingook Kim, Ulsan (KR); Junsik Park, Ulsan (KR)

(73) Assignees: Samsung Electronics Co., Ltd., Suwon-si (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 17/250,323

(22) PCT Filed: Apr. 9, 2019

(86) PCT No.: PCT/KR2019/004206
§ 371 (c)(1),
(2) Date: Jan. 5, 2021

(87) PCT Pub. No.: WO2020/009316
PCT Pub. Date: Jan. 9, 2020

(65) Prior Publication Data
US 2021/0274030 A1    Sep. 2, 2021

(30) Foreign Application Priority Data
Jul. 5, 2018  (KR) .......................... 10-2018-0078173

(51) Int. Cl.
*H04M 1/02* (2006.01)
*H05K 1/02* (2006.01)

(52) U.S. Cl.
CPC .......... *H04M 1/0277* (2013.01); *H05K 1/026* (2013.01)

(58) Field of Classification Search
CPC ....... H04M 1/02; H04M 1/0277; H05K 1/026
(Continued)

(56) References Cited

U.S. PATENT DOCUMENTS 8,593,777 B1   11/2013  Li
9,578,149 B2   2/2017   Moon et al.
(Continued)

FOREIGN PATENT DOCUMENTS

DE   102014102089 A1   8/2015
EP        1612897 A1   1/2006
(Continued)

OTHER PUBLICATIONS

Supplementary European Search Report dated May 28, 2021, in connection with European Patent Application No. 19830435.4, 11 pages.
(Continued)

*Primary Examiner* — Tremesha S Willis

(57) ABSTRACT

An electronic device comprises: a first plate configured to face one surface of the electronic device; a second plate configured to face in a direction opposite to the first plate; a side bezel structure connected to the first plate and the second plate and configured to surround the side of the electronic device; and a printed circuit board mounted in the electronic device and configured to be connected to the side bezel structure, wherein the printed circuit board comprises: a ground area; a first conductive pad, disposed in one area of the printed circuit board, and configured to couple the side
(Continued)

bezel structure and the printed circuit board; and a second conductive pad electrically connected to the ground area and disposed between the first conductive pad and the ground area, wherein the first conductive pad and the second conductive pad may be disposed at an interval through which a current, having a voltage equal to or greater than a threshold voltage between the first conductive pad and a second electrode, may flow.

15 Claims, 8 Drawing Sheets

(58) Field of Classification Search
USPC .......................................................... 361/760
See application file for complete search history.

(56) References Cited

U.S. PATENT DOCUMENTS

| | | | |
|---|---|---|---|
| 10,021,772 | B2 | 7/2018 | Hung et al. |
| 10,327,317 | B2 | 6/2019 | Tokunaga et al. |
| 10,530,912 | B2 | 1/2020 | Moon et al. |
| 10,756,472 | B2 | 8/2020 | Lim et al. |
| 2008/0266730 | A1 | 10/2008 | Viborg et al. |
| 2013/0301171 | A1 | 11/2013 | Li |
| 2017/0048954 | A1 | 2/2017 | Hung et al. |
| 2018/0103531 | A1 | 4/2018 | Tokunaga et al. |
| 2020/0092408 | A1 | 3/2020 | Moon et al. |
| 2020/0212614 | A1 | 7/2020 | Lim et al. |

FOREIGN PATENT DOCUMENTS

| | | |
|---|---|---|
| EP | 1986297 A2 | 10/2008 |
| EP | 3054655 A1 | 8/2016 |
| KR | 10-0541501 B1 | 1/2006 |
| KR | 10-2015-0026569 A | 3/2015 |
| KR | 10-2017-0065386 A | 6/2017 |
| KR | 10-2017-0101144 A | 9/2017 |
| KR | 10-2018-0049945 A | 5/2018 |

OTHER PUBLICATIONS

International Search Report and Written Opinion of the International Searching Authority in connection with International Application No. PCT/KR2019/004206 dated Aug. 9, 2019, 10 pages.

ELECTRONIC DEVICE FOR PROTECTING COMPONENTS FROM SURGE VOLTAGE AND STRUCTURE THEREOF

CROSS-REFERENCE TO RELATED APPLICATIONS

This application is a 371 of International Application No. PCT/KR2019/004206 filed on Apr. 9, 2019, which claims priority to Korean Patent Application No. 10-2018-0078173 filed on Jul. 5, 2018, the disclosures of which are herein incorporated by reference in their entirety.

BACKGROUND

1. Field

Embodiments disclosed in the disclosure relate to an electronic device for protecting components from a surge voltage, and a structure thereof.

2. Description of Related Art

A surge voltage may mean a voltage that rapidly increases during a short time. The surge voltage may be caused by sudden load change in an adjacent circuit, power instability, interference via coupled wires, switch operation, lightning strikes, or ESD (electro static discharge). Because the surge voltage may cause malfunction of components included inside the electronic device, the electronic device must satisfy a test standard (e.g. IEC-61000-4-2 or IEC-61000-4-5) specified by IEC (international electrotechnical commission).

The electronic device may include a frame made of a metal material as at least one surface surrounding the electronic device. Because the frame made of the metal material may transmit current, this may cause a risk of electric shock to a user. For example, when the user charges the electronic device using an unstable power system or a bad quality charger, current is generated in a printed circuit board (PCB) included in the electronic device. Thus, when the user touches the frame, the current may be delivered to the user through the frame. In order to protect the user from the risk of electric shock, the frame and a ground area or a ground (GND) of the printed circuit board may be spaced apart from each other.

When the ground area of the printed circuit board is spaced apart from the frame made of the metal, a potential difference between the frame and the printed circuit board may rise up when a high voltage such as surge voltage is generated outside the electronic device. When the increased potential difference satisfies a specified condition (e.g., air gap breakdown condition), ESD current may flow from the frame to the printed circuit board. To protect the printed circuit board from the surge voltage, an ESD protection element may be disposed between the frame and the ground area of the printed circuit board. However, the ESD protection element does not reduce secondary noise due to the surge voltage and is expensive. This may lead to an increase in a production cost of the electronic device.

Various embodiments disclosed in the disclosure are intended to provide an electronic device for protecting components of the electronic device from the surge voltage, and a structure thereof.

SUMMARY

An electronic device according to an embodiment disclosed in the disclosure includes a first plate configured to define one surface of the electronic device, a second plate configured to be opposite to the first plate, a side bezel structure configured to be connected to the first plate and the second plate and surround a side of the electronic device, and a printed circuit board (PCB) mounted inside the electronic device and configured to be connected to the side bezel structure, wherein the printed circuit board includes a ground area, a first conductive pad disposed in one area of the printed circuit board and configured to allow coupling between the side bezel structure and the printed circuit board, and a second conductive pad electrically connected to the ground area and disposed between the first conductive pad and the ground area, wherein the first conductive pad and the second conductive pad are spaced from each other by a gap through which a current having a voltage equal to or higher than a threshold voltage can flow between the first conductive pad and the second conductive pad.

An electronic device according to an embodiment disclosed in the disclosure includes a first plate configured to define one surface of the electronic device, a second plate configured to be opposite to the first plate, a side bezel structure configured to be connected to the first plate and the second plate and surround a side of the electronic device, and a printed circuit board (PCB) mounted inside the electronic device and configured to be connected to the side bezel structure and to include components of the electronic device, wherein the printed circuit board includes a ground area, a first conductive pad disposed in one area of the printed circuit board and configured to allow coupling between the side bezel structure and the printed circuit board, and a second conductive pad electrically connected to the ground area and disposed between the first conductive pad and the ground area, wherein the first conductive pad and the second conductive pad are spaced from each other by a gap through which a current having a voltage equal to or higher than a threshold voltage can flow between the first conductive pad and the second conductive pad.

According to the embodiments disclosed in the disclosure, the electronic device may protect the components from the surge voltage applied from an outside of the electronic device, and at the same time, may reduce the current flowing in the frame made of the metal material and in the printed circuit board to prevent the risk of electric shock toward the user.

According to the embodiments disclosed in the disclosure, the electronic device may achieve cost reduction via a structural feature that replaces the ESD protection element.

In addition to the above effects, various effects that are directly or indirectly recognized based on the disclosure may be provided.

BRIEF DESCRIPTION OF THE DRAWINGS

With respect to the description of the drawings, the same or similar reference numerals may refer to the same or similar components.

DETAILED DESCRIPTION

Hereinafter, various embodiments of the disclosure will be described with reference to the accompanying drawings. However, the embodiments are not intended to limit the disclosure thereto. Rather, it should be understood that various modifications of, equivalents to, and/or alternatives to the embodiments of the disclosure may be made.

Figure 1:
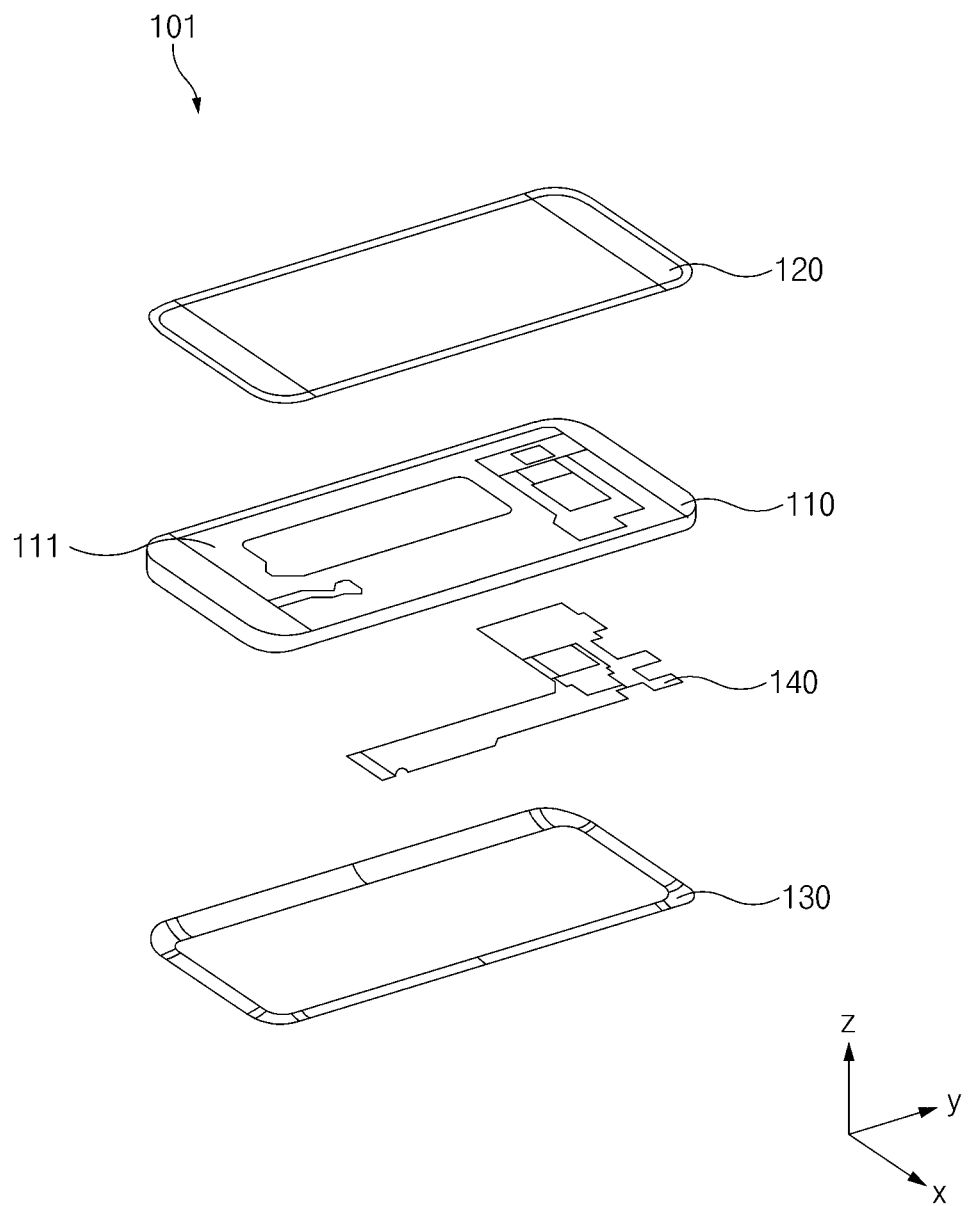
FIG. 1 is an exploded perspective view of an electronic device according to various embodiments.

FIG. 1 is an exploded perspective view of an electronic device 101 according to various embodiments.

Referring to FIG. 1, the electronic device 101 may be at least one of a portable communication device such as a smartphone, and a tablet, a computer device, a portable multimedia device, a portable medical device, a camera, a wearable device, or an artificial intelligence (AI) speaker.

According to an embodiment, the electronic device 101 may include a side bezel structure 110, a support member 111, a front plate 120, a rear plate 130, and a printed circuit board (PCB) 140. According to an embodiment, the electronic device 101 may further include at least one component other than the components shown in FIG. 1. For example, the electronic device 101 may further include at least one of a display, a battery, an antenna, an electromagnetic induction panel, a memory, an interface (e.g., HDMI (high definition multimedia interface), an USB (universal serial bus) interface, a SD card interface, and/or an audio interface), or a rear case. According to another embodiment, the electronic device 101 may be free of at least one of the components shown in FIG. 1.

According to one embodiment, the front plate 120 may be configured to face a first surface of the electronic device 101 (e.g., in +z axis direction). The rear plate 130 may be configured to face a second surface opposite to the first surface (e.g., in -z axis direction).

According to an embodiment, the side bezel structure 110 may be referred to as a frame or a case. The side bezel structure 110 may be configured to be connected to the front plate 120 and the rear plate 130, and to surround sides of the electronic device 101. According to an embodiment, the side bezel structure 110 may be made of a metal material. When the side bezel structure 110 is made of the metal material, the side bezel structure 110 and a ground area of the printed circuit board 140 may be electrically separated from each other to prevent risk of electric shock to the user. For example, an area of the side bezel structure 110 may be larger than an area of the printed circuit board 140. The side bezel structure 10 may be combined with the printed circuit board 140 while the side bezel structure 110 is spaced from the printed circuit board 140.

According to an embodiment, the support member 111 (e.g., a bracket) may be disposed inside the electronic device 101 and may be connected to the side bezel structure 110, or may be integrally formed with the side bezel structure 110. The support member 111 may be made of, for example, a metallic material and/or a non-metal (e.g., a polymer material). The support member 111 may be coupled, on one surface thereof (e.g., in +z axis), to a display, and may be coupled, on the other surface thereof (e.g., in -z axis), to the printed circuit board 140. According to an embodiment, the electronic device 101 may be free of the support member 111.

According to an embodiment, the printed circuit board 140 may include components for implementing functions of the electronic device 101. For example, the printed circuit board 140 may include at least one of a processor, a memory, or an interface. The processor may be, for example, at least one of a central processing unit, an application processor, a graphics processing unit, an image signal processor, a sensor hub processor, or a communication processor.

Figure 2:
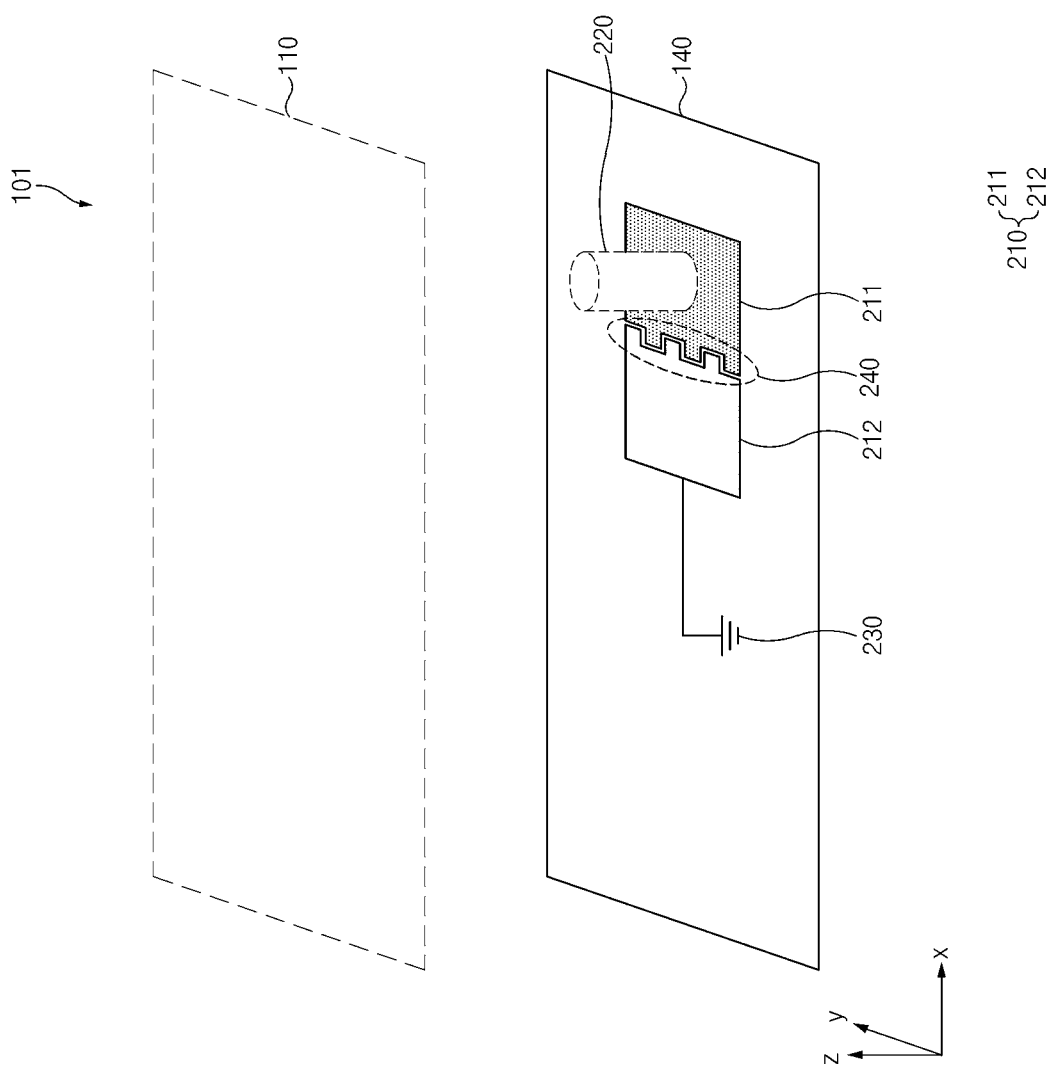
FIG. 2 shows a structure of a printed circuit board (PCB) including a gap defined between conductive pads according to various embodiments.

FIG. 2 illustrates a structure of the printed circuit board 140 including a gap 240 defined between conductive pads according to various embodiments.

Referring to FIG. 2, the printed circuit board 140 may include a conductive pad 210 configured to couple the side bezel structure 110 and the printed circuit board 140 to each other in a partial area thereof, and a ground area 230 that is electrically connected to the conductive pad 210 in another partial area thereof. According to an embodiment, the printed circuit board 140 may further include a separate connector 220 in order to more easily couple the printed circuit board 140 and the side bezel structure 110 to each other.

According to an embodiment, in order to prevent the risk of electric shock to the user by prevent current from transmitting from the printed circuit board 140 to the side bezel structure 110, the conductive pad 210 may be divided into a first conductive pad 211 and a second conductive pad 212. In other words, the first conductive pad 211 may be coupled to the side bezel structure 110, and the second conductive pad 212 may be electrically separated from the first conductive pad 211 but may be electrically connected to the ground area 230.

According to an embodiment, the first conductive pad 211 and the second conductive pad 212 may be spaced from each other by the gap 240 across which a current having a voltage equal to or higher than a threshold voltage may flow. According to an embodiment, the gap 240 defined between the first conductive pad 211 and the second conductive pad 212 may be referred to as a narrow gap or a spark gap.

According to an embodiment, due to the gap 240 defined between the first conductive pad 211 and the second conductive pad 212, current having a voltage lower than the threshold voltage cannot be transferred from the printed circuit board 140 to the side bezel structure 110 even when the current having the voltage lower than the threshold voltage occurs in the printed circuit board 140. Because the current generated in the printed circuit board 140 is not transferred to the side bezel structure 110, the risk of electric shock to the user may be prevented.

According to an embodiment, when current having a voltage (e.g., surge voltage) higher than the threshold voltage occurs in the side bezel structure 110, the insulation function by the gap 240 may be limited. Thus, the current having the voltage higher than the threshold voltage may be transmitted to the ground area 230 through the first conductive pad 211 and the second conductive pad 212. When the current having the voltage higher than the threshold voltage is transmitted to the ground area 230 through the first conductive pad 211 and the second conductive pad 212, malfunction of components included in the electronic device 101 (or components included in the printed circuit board 140) may be prevented. According to an embodiment, as the gap 240 is narrower, the threshold voltage may be low.

Figure 3:
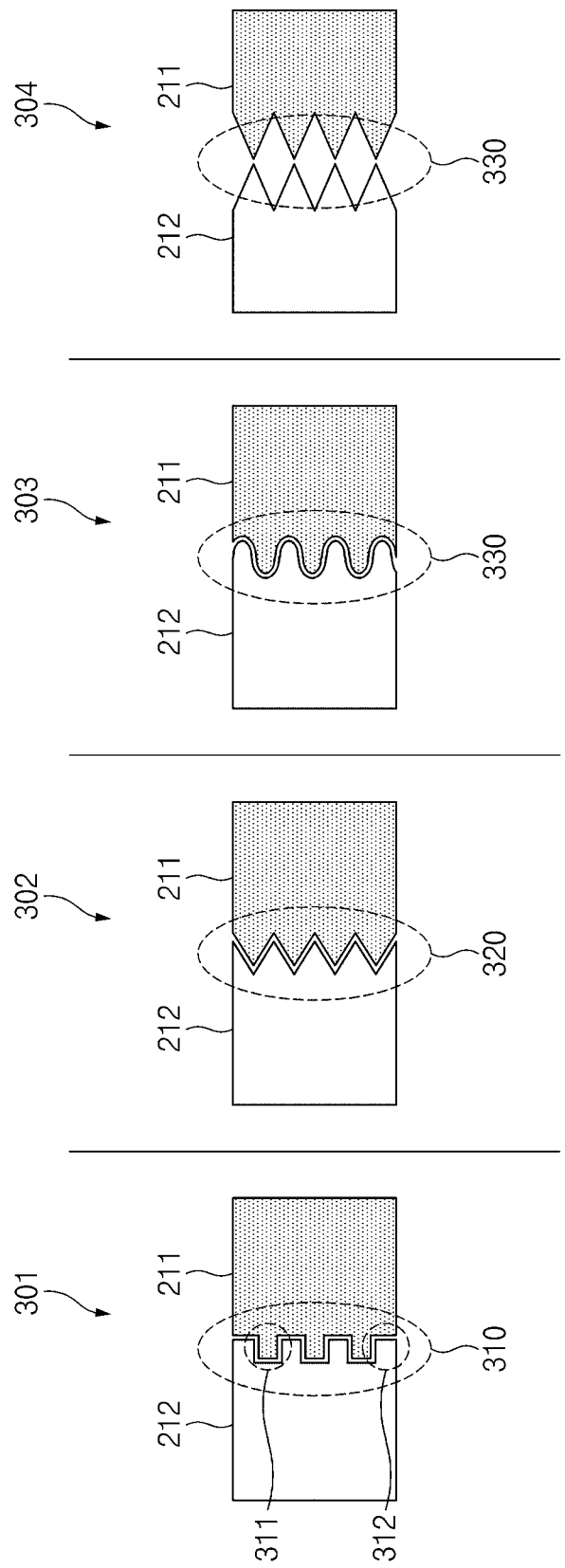
FIG. 3 is a diagram illustrating shapes of one side of a first conductive pad and one side of a second conductive pad according to various embodiments.

FIG. 3 illustrates shapes of one side of the first conductive pad 211 and one side of the second conductive pad 212 according to various embodiments.

Referring to FIG. 3, one side of the first conductive pad 211 and one side of the second conductive pad 212 may be spaced from each other by a gap 240 extending in a zig-zag manner. The current may be transmitted more efficiently between the first conductive pad 211 and the second conductive pad 212 through the gap 240 extending in the zig-zag manner because the zig-zag manner allows a length along which one side of the first conductive pad 211 and one side of the second conductive pad 212 face away each other to increase, and allows a spacing between the first conductive pad 211 and the second conductive pad 212 to decrease.

In one example, as shown in a reference number 301, one side of the first conductive pad 211 and one side of the second conductive pad 212 may be spaced from each other by the gap 240 extending in a right-angled zig-zag manner 310. In another example, as shown by a reference numeral 302, one side of the first conductive pad 211 and one side of the second conductive pad 212 may be spaced from each other by the gap 240 in a non-right angled zig-zag manner 320. In another example, as shown by a reference numeral 303, one side of the first conductive pad 211 and one side of the second conductive pad 212 may be spaced from each other by the gap 240 in a round zig-zag manner 330. According to an embodiment, one side of the first conductive pad 211 and one side of the second conductive pad 212 may be spaced from each other by the gap extending in various zig-zag manners in addition to those shown in FIG. 3.

According to an embodiment, the gap 240 defined between one side of the first conductive pad 211 and one side of the second conductive pad 212 may not extend in the zig-zag manner. For example, as shown in a reference number 304, a portion protruding from one side of the first conductive pad 211 (e.g., a portion 311 of the reference number 301) may face away a portion protruding from one side of the second conductive pad 212 (e.g., a portion 312 of the reference number 301).

Figure 4:
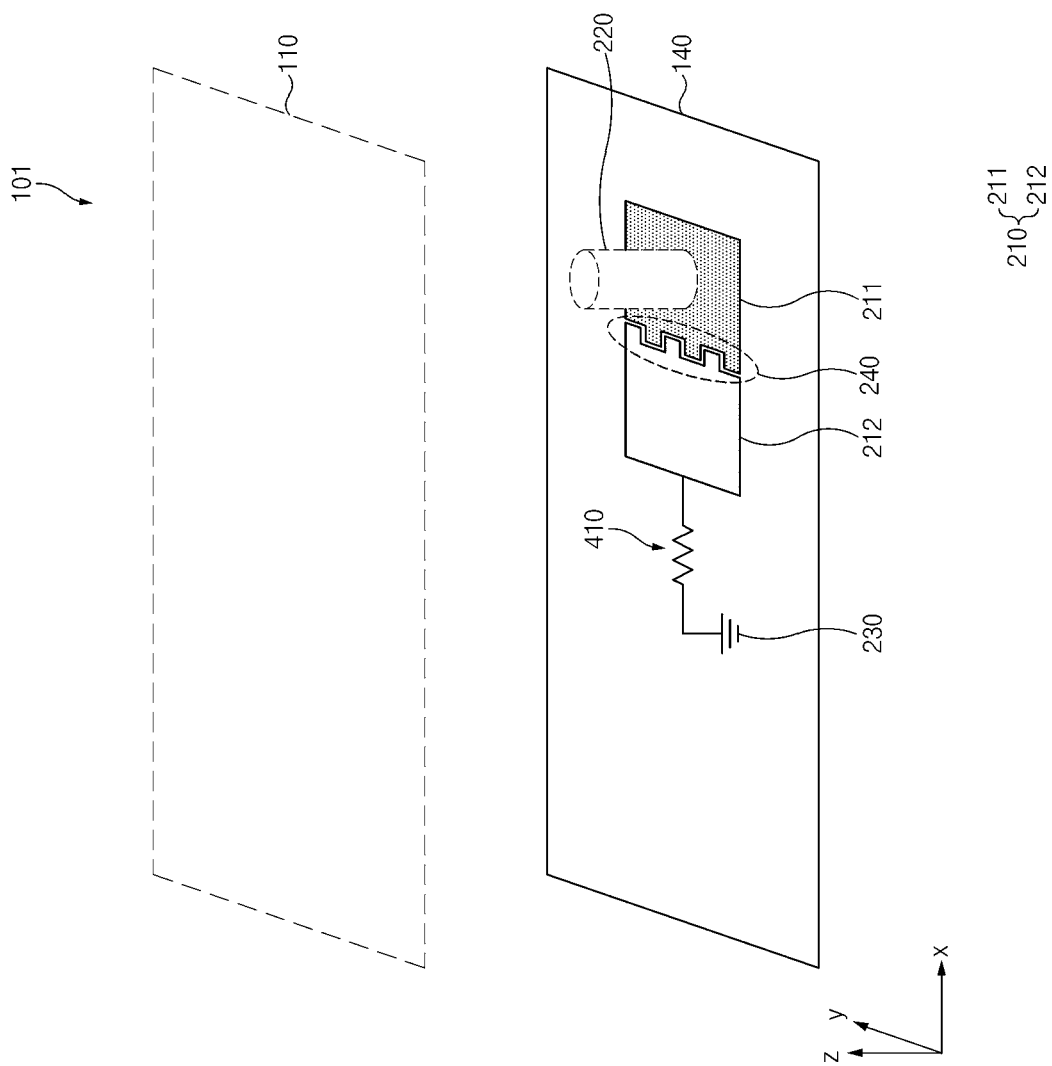
FIG. 4 shows a structure of a printed circuit board further including a resistor element according to various embodiments.

FIG. 4 shows a structure of the printed circuit board 140 further including a resistor element 410 according to various embodiments.

Referring to FIG. 4, the printed circuit board 140 may further include the resistor element 410 disposed between the second conductive pad 212 and the ground area 230. The resistor element 410 may be, for example, a SMT (surface mount technology) resistor element (or a resistor element mounted using SMT). According to an embodiment, when current having a voltage (e.g., a surge voltage) higher than the threshold voltage flows to the ground area 230 through the first conductive pad 211 and the second conductive pad 212, secondary noise (or electromagnetic field) which causes malfunction of components of the electronic device 101 (or components mounted on the PCB 140) may occur. According to an embodiment, the resistor element 410 disposed between the second conductive pad 212 and the ground area 230 may reduce a magnitude of the voltage to prevent the secondary noise.

Figure 5:
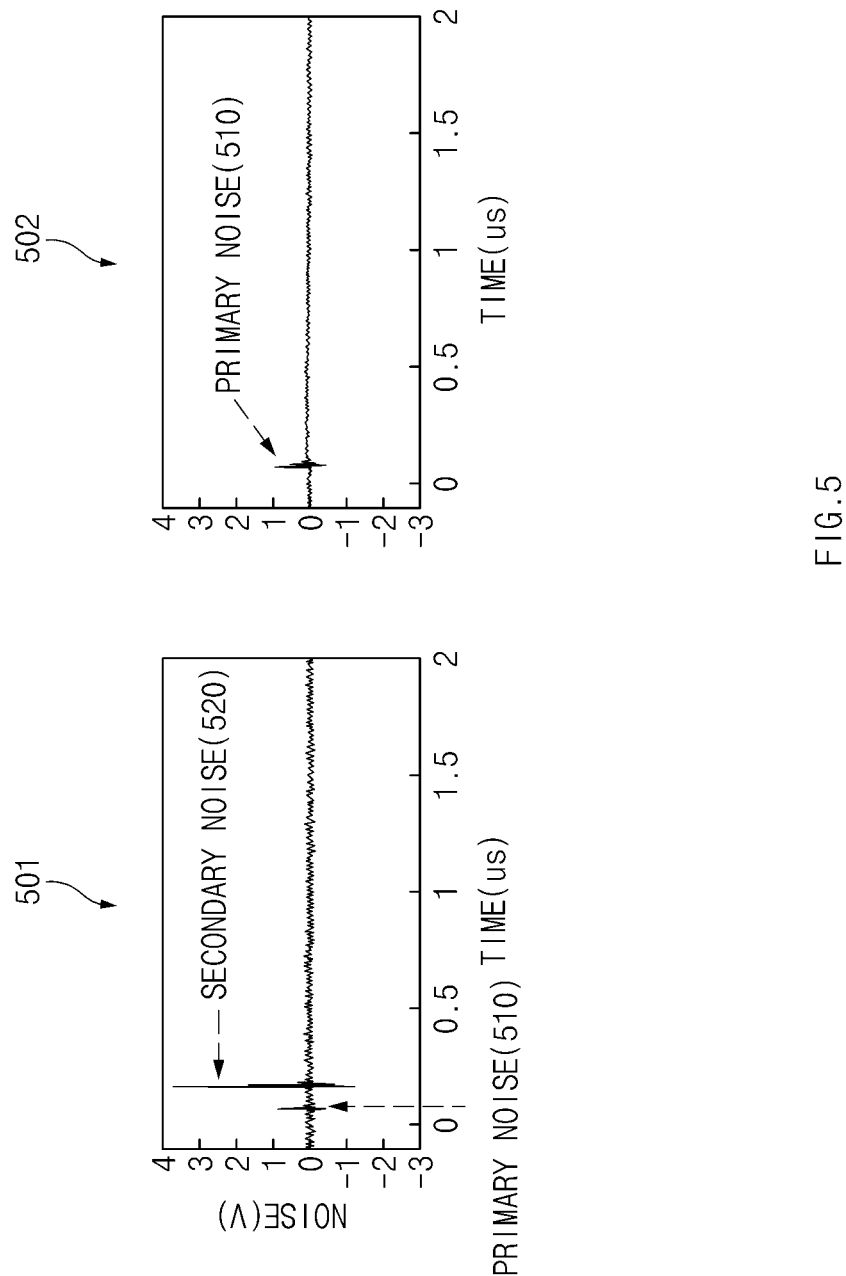
FIG. 5 is a graph illustrating a change amount of a voltage generated on a printed circuit board over time according to various embodiments.

FIG. 5 is a graph 502 illustrating a change amount of a voltage generated on the printed circuit board 140 over time according to various embodiments.

Referring to FIG. 5, a graph 501 may represent a voltage of a noise signal over time when a surge voltage is applied from the side bezel structure 110 when an existing ESD protection element is mounted on the printed circuit board 140. The graph 502 may represent a voltage of a noise signal over time when the surge voltage is applied from the side bezel structure 110 while the first conductive pad 211 and the second conductive pad 212 on the printed circuit board 140 are separated from each other, and the resistor element 410 is disposed between the second conductive pad 212 and the ground area 230.

Referring to the graph 501, secondary noise 520 generated due to a high voltage in addition to primary noise 510 may be measured in the printed circuit board 140. The generated secondary noise 520 may cause malfunction of components included in the printed circuit board 140. Referring to the graph 520, the voltage decreases due to the resistor element 410, such that the secondary noise 520 may not be measured.

Figure 6:
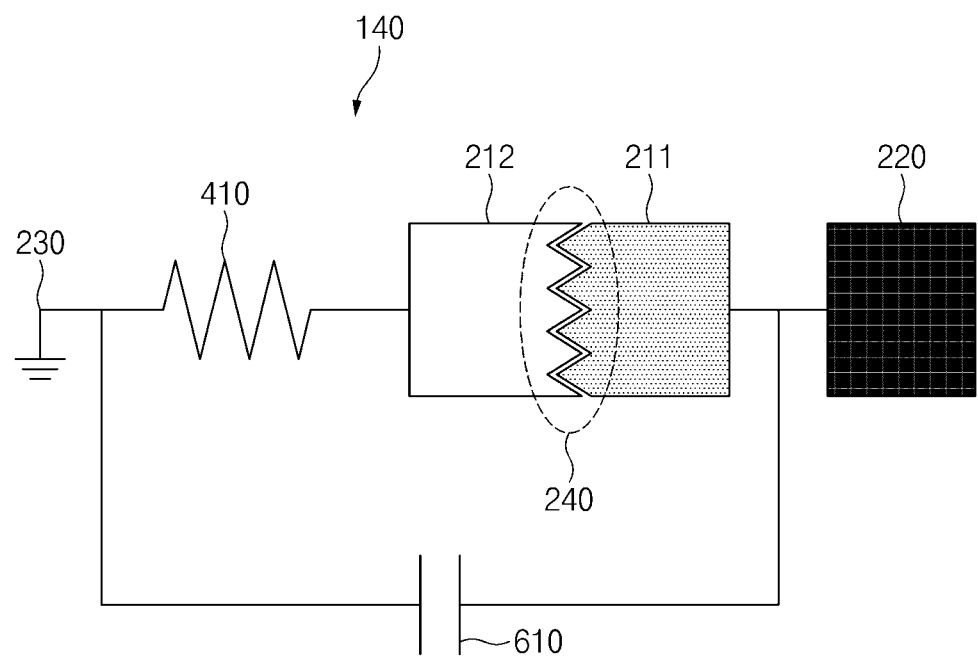
FIG. 6 illustrates a structure of a printed circuit board further including a capacitor according to various embodiments.

FIG. 6 illustrates a structure of the printed circuit board 140 further including a capacitor 610 according to various embodiments. FIG. 6 shows an embodiment in which the capacitor 610 is further included in the structure of the printed circuit board 140 shown in FIG. 4. The same principle may be applied to the structure of the printed circuit board 140 shown in FIG. 2. Further, FIG. 6 shows an example in which the gap 240 defined between the first conductive pad 211 and the second conductive pad 212 has the form shown in the reference numeral 302 in FIG. 3. However, the same principle may be applied to other forms as shown in FIG. 3.

Referring to FIG. 6, the printed circuit board 140 may further include the capacitor 610 between the connector 220 and the ground area 230. For example, the capacitor 610 may be arranged in parallel with a series of the first conductive pad 211 and the second conductive pad 212.

According to an embodiment, when the side bezel structure 110 is made of the metal material, at least a partial area of the side bezel structure 110 may perform an antenna function for transmitting a signal in a radio frequency band. Because the capacitor 610 has a specified capacitance, the capacitor 610 may adjust transmission/reception performance of a signal transmitted from the printed circuit board 140 to the side bezel structure 110 or vice versa through the connector 220 by using resonance.

Figure 7:
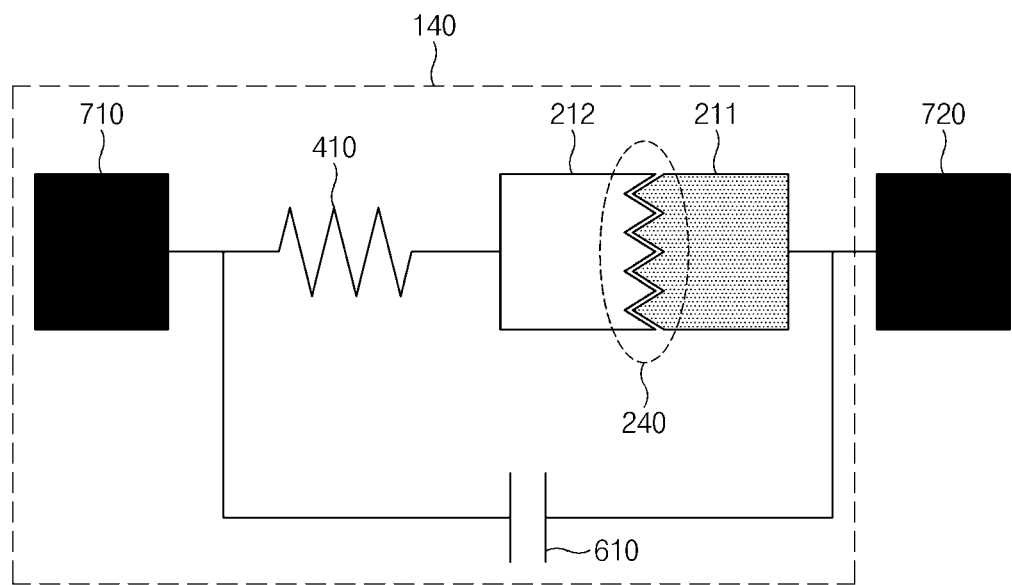
FIG. 7 shows a structure of a printed circuit board including a capacitor and a gap defined between an antenna housing and a communication circuit according to various embodiments.

FIG. 7 shows a structure of the printed circuit board 140 including the capacitor 610 and the gap 240 defined between an antenna housing 720 and a communication circuit 710 according to various embodiments. FIG. 7 shows an embodiment in which the communication circuit 710 and the capacitor 610 are further included in the structure of the printed circuit board 140 shown in FIG. 4. However, the same principle may be applied to the structure of the printed circuit board 140 shown in FIG. 2. Further, FIG. 7 shows an embodiment in which the gap 240 defined between the first conductive pad 211 and the second conductive pad 212 has the form shown in the reference numeral 302 of FIG. 3. However, the same principle may be applied to other forms as shown in FIG. 3.

Referring to FIG. 7, the printed circuit board 140 may be electrically connected to the antenna housing 720. According to an embodiment, the antenna housing 720 may be configured to define at least a partial area of the side bezel structure 110 and perform an antenna function. According to another embodiment, the antenna housing 720 may be a separate component from the side bezel structure 110.

According to an embodiment, the printed circuit board 140 may include the communication circuit 710 configured to process a signal in order to perform communication in a radio frequency band. For example, the communication circuit 710 may correspond to a communication module 890 in FIG. 8.

According to an embodiment, the printed circuit board 140 may further include the capacitor 610 between the antenna housing 720 and the communication circuit 710. For example, the capacitor 610 may be arranged in parallel with a series of the first conductive pad 211 and the second conductive pad 212. While a frequency of signal transmissions may decrease due to the gap 240 defined between the first conductive pad 211 and the second conductive pad 212, the capacitor 610 may have a capacitance to increase signal transmission performance.

Figure 8:
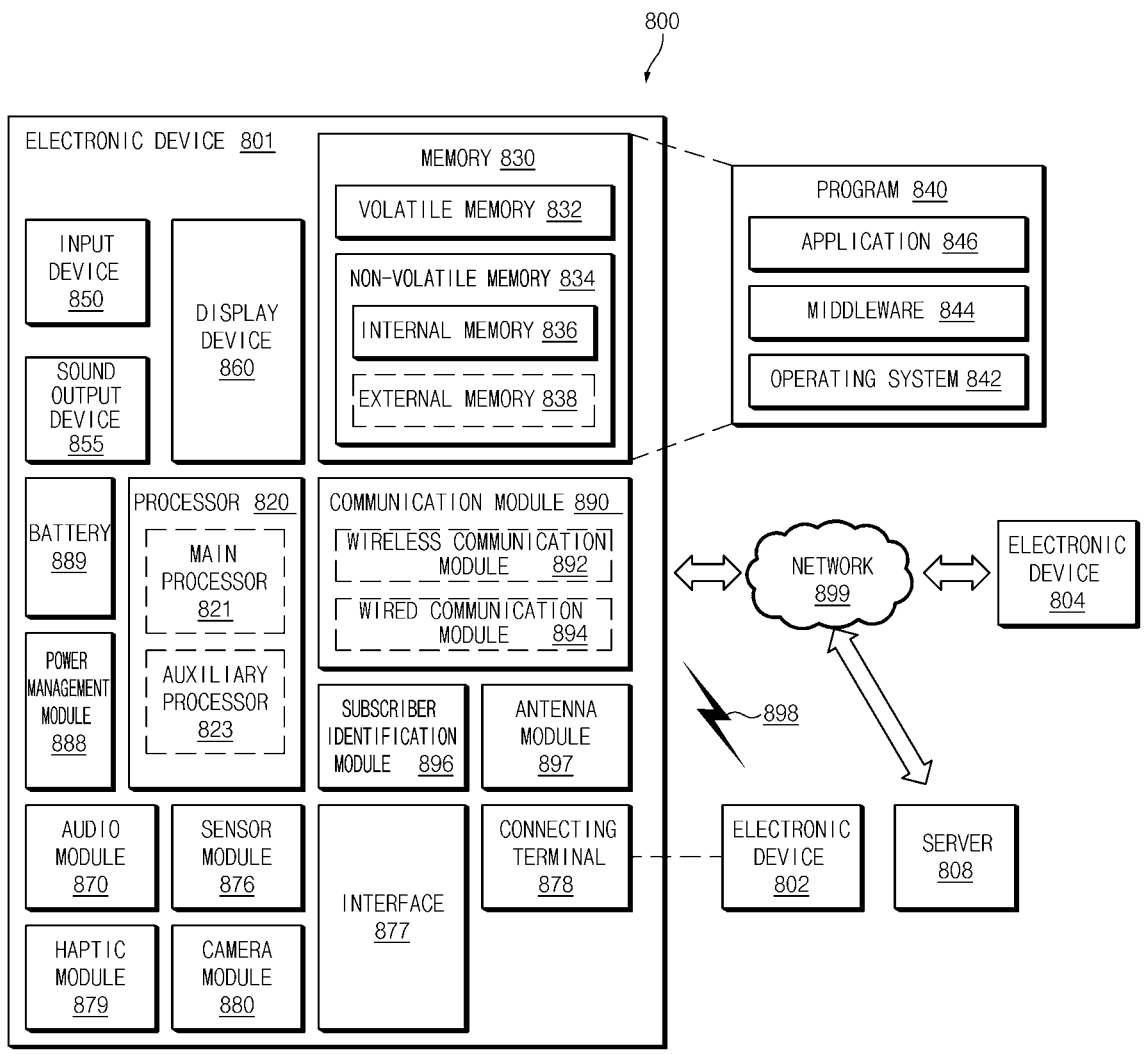
FIG. 8 is a block diagram of an electronic device in a network environment according to various embodiments.

FIG. 8 is a block diagram of an electronic device in a network environment according to various embodiments.

Referring to FIG. 8, an electronic device 101 may communicate with an electronic device 802 through a first network 898 (e.g., a short-range wireless communication) or may communicate with an electronic device 804 or a server 808 through a second network 899 (e.g., a long-distance wireless communication) in a network environment 800. According to an embodiment, the electronic device 101 may communicate with the electronic device 804 through the server 808. According to an embodiment, the electronic device 101 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a subscriber identification module 896, and an antenna module 897. According to some embodiments, at least one (e.g., the display device 860 or the camera module 880) among components of the electronic device 101 may be omitted or other components may be added to the electronic device 101. According to some embodiments, some components may be integrated and implemented as in the case of the sensor module 876 (e.g., a fingerprint sensor, an iris sensor, or an illuminance sensor) embedded in the display device 860 (e.g., a display).

The processor 820 may operate, for example, software (e.g., a program 840) to control at least one of other components (e.g., a hardware or software component) of the electronic device 101 connected to the processor 820 and may process and compute a variety of data. The processor 820 may load a command set or data, which is received from other components (e.g., the sensor module 876 or the communication module 890), into a volatile memory 832, may process the loaded command or data, and may store result data into a nonvolatile memory 834. According to an embodiment, the processor 820 may include a main processor 821 (e.g., a central processing unit or an application processor) and an auxiliary processor 823 (e.g., a graphic processing device, an image signal processor, a sensor hub processor, or a communication processor), which operates independently from the main processor 821, additionally or alternatively uses less power than the main processor 821, or is specified to a designated function. In this case, the auxiliary processor 823 may operate separately from the main processor 821 or embedded.

In this case, the auxiliary processor 823 may control, for example, at least some of functions or states associated with at least one component (e.g., the display device 860, the sensor module 876, or the communication module 890) among the components of the electronic device 101 instead of the main processor 821 while the main processor 821 is in an inactive (e.g., sleep) state or together with the main processor 821 while the main processor 821 is in an active (e.g., an application execution) state. According to an embodiment, the auxiliary processor 823 (e.g., the image signal processor or the communication processor) may be implemented as a part of another component (e.g., the camera module 880 or the communication module 890) that is functionally related to the auxiliary processor 823. The memory 830 may store a variety of data used by at least one component (e.g., the processor 820 or the sensor module 876) of the electronic device 101, for example, software (e.g., the program 840) and input data or output data with respect to commands associated with the software. The memory 830 may include the volatile memory 832 or the nonvolatile memory 834.

The program 840 may be stored in the memory 830 as software and may include, for example, an operating system 842, a middleware 844, or an application 846.

The input device 850 may be a device for receiving a command or data, which is used for a component (e.g., the processor 820) of the electronic device 101, from an outside (e.g., a user) of the electronic device 101 and may include, for example, a microphone, a mouse, or a keyboard.

The sound output device 855 may be a device for outputting a sound signal to the outside of the electronic device 101 and may include, for example, a speaker used for general purposes, such as multimedia play or recordings play, and a receiver used only for receiving calls. According to an embodiment, the receiver and the speaker may be either integrally or separately implemented.

The display device 860 may be a device for visually presenting information to the user of the electronic device 101 and may include, for example, a display, a hologram device, or a projector and a control circuit for controlling a corresponding device. According to an embodiment, the display device 860 may include a touch circuitry or a pressure sensor for measuring an intensity of pressure on the touch.

The audio module 870 may convert a sound and an electrical signal in dual directions. According to an embodiment, the audio module 870 may obtain the sound through the input device 850 or may output the sound through an external electronic device (e.g., the electronic device 802 (e.g., a speaker or a headphone)) wired or wirelessly connected to the sound output device 855 or the electronic device 101.

The sensor module 876 may generate an electrical signal or a data value corresponding to an operating state (e.g., power or temperature) inside or an environmental state outside the electronic device 101. The sensor module 876 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 877 may support a designated protocol wired or wirelessly connected to the external electronic device (e.g., the electronic device 802). According to an embodiment, the interface 877 may include, for example, an HDMI (high-definition multimedia interface), a USB (universal serial bus) interface, an SD card interface, or an audio interface.

A connecting terminal 878 may include a connector that physically connects the electronic device 101 to the external electronic device (e.g., the electronic device 802), for example, an HDMI connector, a USB connector, an SD card connector, or an audio connector (e.g., a headphone connector).

The haptic module 879 may convert an electrical signal to a mechanical stimulation (e.g., vibration or movement) or an electrical stimulation perceived by the user through tactile or kinesthetic sensations. The haptic module 879 may include, for example, a motor, a piezoelectric element, or an electric stimulator.

The camera module 880 may shoot a still image or a video image. According to an embodiment, the camera module 880 may include, for example, at least one lens, an image sensor, an image signal processor, or a flash.

The power management module 888 may be a module for managing power supplied to the electronic device 101 and may serve as at least a part of a power management integrated circuit (PMIC).

The battery 889 may be a device for supplying power to at least one component of the electronic device 101 and may include, for example, a non-rechargeable (primary) battery, a rechargeable (secondary) battery, or a fuel cell.

The communication module 890 may establish a wired or wireless communication channel between the electronic device 101 and the external electronic device (e.g., the electronic device 802, the electronic device 804, or the server 808) and support communication execution through the established communication channel. The communication module 890 may include at least one communication processor operating independently from the processor 820 (e.g., the application processor) and supporting the wired communication or the wireless communication. According to an embodiment, the communication module 890 may include a wireless communication module 892 (e.g., a cellular communication module, a short-range wireless communication module, or a GNSS (global navigation satellite system) communication module) or a wired communication module 894 (e.g., an LAN (local area network) communication module or a power line communication module) and may communicate with the external electronic device using a corresponding communication module among them through the first network 898 (e.g., the short-range communication network such as a Bluetooth, a WiFi direct, or an IrDA (infrared data association)) or the second network 899 (e.g., the long-distance wireless communication network such as a cellular network, an internet, or a computer network (e.g., LAN or WAN)). The above-mentioned various communication modules 890 may be implemented into one chip or into separate chips, respectively.

According to an embodiment, the wireless communication module 892 may identify and authenticate the electronic device 101 using user information stored in the subscriber identification module 896 in the communication network.

The antenna module 897 may include one or more antennas to transmit or receive the signal or power to or from an external source. According to an embodiment, the communication module 890 (e.g., the wireless communication module 892) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 101 and the external electronic device 804 through the server 808 connected to the second network 899. Each of the electronic devices 802 and 804 may be the same or different types as or from the electronic device 101. According to an embodiment, all or some of the operations performed by the electronic device 101 may be performed by another electronic device or a plurality of external electronic devices. When the electronic device 101 performs some functions or services automatically or by request, the electronic device 101 may request the external electronic device to perform at least some of the functions related to the functions or services, in addition to or instead of performing the functions or services by itself. The external electronic device receiving the request may carry out the requested function or the additional function and transmit the result to the electronic device 101. The electronic device 101 may provide the requested functions or services based on the received result as is or after additionally processing the received result. To this end, for example, a cloud computing, distributed computing, or client-server computing technology may be used.

As described above, the electronic device (e.g., the electronic device 101 in FIG. 1) includes a first plate (e.g., the front plate 120 in FIG. 1) configured to define one surface of the electronic device, a second plate (e.g. the rear plate 130 in FIG. 1) configured to be opposite to the first plate, a side bezel structure (e.g., the side bezel structure 110 in FIG. 1) configured to be connected to the first plate and the second plate and to surround a side of the electronic device, and a printed circuit board (e.g., the printed circuit board 140 in FIG. 1) mounted inside the electronic device and configured to be connected to the side bezel structure, wherein the printed circuit board includes a ground area (e.g., the ground area 230 in FIG. 2), a first conductive pad (e.g., the first conductive pad 211 in FIG. 2) disposed in one area of the printed circuit board and configured to allow coupling between the side bezel structure and the printed circuit board, and a second conductive pad area (e.g., the second conductive pad 212 in FIG. 2) electrically connected to the ground area and disposed between the first conductive pad and the ground, wherein the first conductive pad and the second conductive pad may be spaced from each other by a gap (e.g., the gap 240 in FIG. 2) through which a current having a voltage equal to or higher than a threshold voltage may flow between the first conductive pad and the second conductive pad.

According to an embodiment, the side bezel structure may be made of a metal material.

According to an embodiment, the electronic device may further include a connector (e.g., the connector 220 in FIG. 2) operatively coupled to the first conductive pad and configured to facilitate coupling between the first conductive pad and the side bezel structure.

According to an embodiment, each of one side of the first conductive pad and one side of the second conductive pad facing away the one side of the first conductive pad may extend in a zig-zag manner.

According to an embodiment, the zig-zag manner may include a right-angled zig-zag manner, a non-right-angled zig-zag manner or a round zig-zag manner According to an embodiment, the electronic device may further include a resistor element (e.g., the resistor element 410 of FIG. 4) disposed between the second conductive pad and the ground area.

According to an embodiment, the resistor element may include a SMT resistor element.

According to an embodiment, the side bezel structure may be connected to a top of the printed circuit board and may have a larger area than an area of the printed circuit board.

According to an embodiment, the side bezel structure may be coupled to the printed circuit board while an inner side surface of the side bezel structure is spaced from a side surface of the PCB.

According to an embodiment, the printed circuit board may be configured to include an application processor (AP) of the electronic device.

As described above, the electronic device (e.g., the electronic device 101 in FIG. 1) includes a first plate (e.g., the front plate 120 in FIG. 1) configured to define one surface of the electronic device, a second plate (e.g. the rear plate 130 in FIG. 1) configured to be opposite to the first plate, a side bezel structure (e.g., the side bezel structure 110 in FIG. 1) configured to be connected to the first plate and the second plate and to surround a side of the electronic device, and a printed circuit board (e.g., the printed circuit board 140 in FIG. 1) mounted inside the electronic device and configured to be connected to the side bezel structure and to include components of the electronic device, wherein the printed circuit board includes a ground area (e.g., the ground area 230 in FIG. 2), a first conductive pad (e.g., the first conductive pad 211 in FIG. 2) disposed in one area of the printed circuit board and configured to allow coupling between the side bezel structure and the printed circuit board, and a second conductive pad area (e.g., the second conductive pad 212 in FIG. 2) electrically connected to the ground area and disposed between the first conductive pad and the ground, wherein the first conductive pad and the second conductive pad may be spaced from each other by a gap (e.g., the gap 240 in FIG. 2) through which a current having a voltage equal to or higher than a threshold voltage may flow between the first conductive pad and the second conductive pad.

According to an embodiment, the side bezel structure may be made of a metal material.

According to an embodiment, the electronic device may further include a connector (e.g., the connector 220 in FIG. 2) operatively coupled to the first conductive pad and configured to facilitate coupling between the first conductive pad and the side bezel structure.

According to an embodiment, each of one side of the first conductive pad and one side of the second conductive pad facing away the one side of the first conductive pad may extend in a zig-zag manner.

According to an embodiment, the zig-zag manner may include a right-angled zig-zag manner, a non-right-angled zig-zag manner or a round zig-zag manner According to an embodiment, the electronic device may further include a resistor element (e.g., the resistor element 410 of FIG. 4) disposed between the second conductive pad and the ground area.

According to an embodiment, the resistor element may include a SMT resistor element.

According to an embodiment, the side bezel structure may be connected to a top of the printed circuit board and may have a larger area than an area of the printed circuit board.

According to an embodiment, the side bezel structure may be coupled to the printed circuit board wile an inner side surface of the side bezel structure is spaced from a side surface of the PCB.

According to an embodiment, the printed circuit board may be configured to include an AP of the electronic device.

The electronic device according to various embodiments disclosed in the disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be understood that various embodiments of the disclosure and terms used in the embodiments do not intend to limit technologies disclosed in the disclosure to the particular forms disclosed herein; rather, the disclosure should be construed to cover various modifications, equivalents, and/or alternatives of embodiments of the disclosure. With regard to description of drawings, similar components may be assigned with similar reference numerals. As used herein, singular forms may include plural forms as well unless the context clearly indicates otherwise. In the disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the disclosure may be implemented by software (e.g., the program 840) including an instruction stored in a machine-readable storage media (e.g., an internal memory 836 or an external memory 838) readable by a machine (e.g., a computer). The machine may be a device that calls the instruction from the machine-readable storage media and operates depending on the called instruction and may include the electronic device (e.g., the electronic device 101). When the instruction is executed by the processor (e.g., the processor 820), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the disclosure may be executed sequentially, in parallel, repeatedly, or in a heuristic method. Also, at least some operations may be executed in different sequences, omitted, or other operations may be added.

The invention claimed is:

1. An electronic device comprising:
a first plate configured to face one surface of the electronic device;
a second plate configured to face opposite surface of the first plate;
a side bezel structure configured to be connected to the first plate and the second plate and surround a side of the electronic device; and
a printed circuit board (PCB) mounted inside the electronic device and configured to be connected to the side bezel structure,
wherein the printed circuit board includes:
a ground area;
a first conductive pad disposed in one area of the printed circuit board and configured to allow coupling between the side bezel structure and the printed circuit board; and
a second conductive pad electrically connected to the ground area and disposed between the first conductive pad and the ground area,
wherein the first conductive pad and the second conductive pad are spaced from each other by a gap through which a current having a voltage equal to or higher than a threshold voltage, between the first conductive pad and the second conductive pad, can flow.

2. The device of claim 1, wherein the side bezel structure is made of a metal.

3. The device of claim 1, further comprising a connector operatively coupled to the first conductive pad and configured to facilitate coupling between the side bezel structure and the first conductive pad.

4. The device of claim 1, wherein one side of the first conductive pad and one side of the second conductive pad facing to the one side of the first conductive pad are spaced from each other in a zig-zag manner.

5. The device of claim 4, wherein the zig-zag manner includes a right-angled zig-zag manner, a non-right-angled zig-zag manner or a round zig-zag manner.

6. The device of claim 1, further comprising a resistor element disposed between the second conductive pad and the ground area.

7. The device of claim 6, wherein the resistor element includes a SMT (surface mount technology) resistor element.

8. The device of claim 1, wherein the side bezel structure is connected to a top of the printed circuit board and has a larger area than an area of the printed circuit board.

9. The device of claim 8, wherein the side bezel structure is coupled to the printed circuit board while an inner side surface of the side bezel structure is spaced from a side surface of the printed circuit board.

10. The device of claim 1, wherein the printed circuit board is configured to include an application processor (AP) of the electronic device.

11. An electronic device comprising:
a first plate configured to face one surface of the electronic device;
a second plate configured to face opposite surface of the first plate;
a side bezel structure configured to be connected to the first plate and the second plate and surround a side of the electronic device; and
a printed circuit board (PCB) mounted inside the electronic device and configured to be connected to the side bezel structure and to include components of the electronic device,
wherein the printed circuit board includes:
a ground area;
a first conductive pad disposed in one area of the printed circuit board and configured to allow coupling between the side bezel structure and the printed circuit board; and
a second conductive pad electrically connected to the ground area and disposed between the first conductive pad and the ground area,
wherein the first conductive pad and the second conductive pad are spaced from each other by a gap through which a current having a voltage equal to or higher than a threshold voltage, between the first conductive pad and the second conductive pad, can flow.

12. The device of claim 11, wherein the side bezel structure is made of a metal.

13. The device of claim 11, further comprising a connector operatively coupled to the first conductive pad and configured to facilitate coupling between the side bezel structure and the first conductive pad.

14. The device of claim 11, wherein each of one side of the first conductive pad and one side of the second conductive pad facing away the one side of the first conductive pad extends in a zig-zag manner.

15. The device of claim 14, wherein the zig-zag manner includes a right-angled zig-zag manner, a non-right-angled zig-zag manner or a round zig-zag manner.

* * * * *